(12) United States Patent
Hasebe et al.

(10) Patent No.: US 10,788,526 B2
(45) Date of Patent: Sep. 29, 2020

(54) ELECTROSTATIC INDICATOR

(71) Applicant: DIC Corporation, Tokyo (JP)

(72) Inventors: Hiroshi Hasebe, Kita-adachi-gun (JP); Shirou Taniguchi, Kita-adachi-gun (JP); Wei Wu, Kita-adachi-gun (JP)

(73) Assignee: DIC CORPORATION, Tokyo (JP)

( * ) Notice: Subject to any disclaimer, the term of this patent is extended or adjusted under 35 U.S.C. 154(b) by 65 days.

(21) Appl. No.: 15/998,531

(22) Filed: Aug. 16, 2018

(65) Prior Publication Data
US 2019/0064242 A1    Feb. 28, 2019

(30) Foreign Application Priority Data
Aug. 30, 2017  (JP) ................. 2017-165520

(51) Int. Cl.
| | |
|---|---|
| *G01R 29/14* | (2006.01) |
| *G02F 1/13* | (2006.01) |
| *G06F 3/041* | (2006.01) |
| *G02F 1/1343* | (2006.01) |
| *G02F 1/1334* | (2006.01) |
| *G02F 1/137* | (2006.01) |
| *C09K 19/30* | (2006.01) |

(Continued)

(52) U.S. Cl.
CPC .......... *G01R 29/14* (2013.01); *C09K 19/3066* (2013.01); *C09K 19/542* (2013.01); *C09K 19/60* (2013.01); *G02F 1/137* (2013.01); *G02F 1/1334* (2013.01); *G02F 1/134309* (2013.01); *C09K 2019/123* (2013.01); *C09K 2019/3004* (2013.01); *C09K 2019/3009* (2013.01); *C09K 2019/3016* (2013.01); *G01R 31/001* (2013.01); *G02F 1/133371* (2013.01); *G02F 2001/13706* (2013.01); *G02F 2001/13712* (2013.01)

(58) Field of Classification Search
CPC ...... G02F 1/1343; G02F 1/1334; G02F 1/136; G02F 1/137; G02F 1/1333; G02F 1/1345; G02F 1/1368; G02F 1/1339; G01R 29/14; G06F 3/041
See application file for complete search history.

(56) References Cited

U.S. PATENT DOCUMENTS

| | | | |
|---|---|---|---|
| 5,784,137 A * | 7/1998 | Shiomi | C09K 19/544 349/88 |
| 6,111,627 A * | 8/2000 | Kim | G02F 1/134363 349/141 |

(Continued)

FOREIGN PATENT DOCUMENTS

| | | | | |
|---|---|---|---|---|
| CN | 205427380 | * | 8/2016 | ............... G02F 1/33 |
| JP | 7-159467 A | | 6/1995 | |

(Continued)

*Primary Examiner* — Neel D Shah
(74) *Attorney, Agent, or Firm* — Westerman, Hattori, Daniels & Adrian, LLP

(57) ABSTRACT

The inventors have intensively studied and found that an electrostatic indicator that can visualize the magnitude of its charge potential can be provided by using a liquid crystal composition and forming multiple regions in which the alignment of the molecules of the liquid crystal composition differently changes in response to electric potential. Furthermore, there is provided an electrostatic indicator that can be placed in a two-dimensional or three-dimensional manner to also visualize spatial distribution of high or low charge potential.

13 Claims, 9 Drawing Sheets

(51) Int. Cl.
*C09K 19/60* (2006.01)
*C09K 19/54* (2006.01)
*G02F 1/1333* (2006.01)
*C09K 19/12* (2006.01)
*G01R 31/00* (2006.01)

(56) References Cited

U.S. PATENT DOCUMENTS

| | | | | |
|---|---|---|---|---|
| 6,356,324 | B1* | 3/2002 | Nishiguchi | G02B 5/3016 349/117 |
| 7,965,364 | B2* | 6/2011 | Lin | G02F 1/134363 349/141 |
| 9,488,882 | B2* | 11/2016 | Hirakata | G02F 1/134363 |
| 2001/0009352 | A1* | 7/2001 | Moore | C03B 37/025 313/582 |
| 2004/0263749 | A1* | 12/2004 | Jeong | G02F 1/134363 349/141 |
| 2008/0231785 | A1* | 9/2008 | Harada | C09K 19/32 349/123 |
| 2008/0259226 | A1* | 10/2008 | Broer | G02B 26/02 349/1 |
| 2013/0342773 | A1* | 12/2013 | Chu | C09K 19/02 349/33 |
| 2017/0285420 | A1* | 10/2017 | Okuyama | G02F 1/133528 |

FOREIGN PATENT DOCUMENTS

| | | |
|---|---|---|
| JP | 11-211771 A | 8/1999 |
| JP | 2004-225200 A | 8/2004 |

* cited by examiner

ELECTROSTATIC INDICATOR

BACKGROUND OF THE INVENTION

1. Field of the Invention

The present invention relates to an electrostatic indicator that visualizes a charged state.

2. Description of the Related Art

It is very important to comprehend the state of electrostatic potential, namely the magnitude of electrostatic potential, at any time. In the chemical industry, for example, ignition of the gas of an organic solvent due to static electricity needs to be pretended in terms of security (see Japanese Unexamined Patent Application Publication Nos. 2004-225200 and 7-159467).

The magnitude of charge potential can be measured with a measuring instrument having an electrode probe (potential sensor); however, electric power needs to be supplied from the outside to operate the electric circuit thereof. Externally supplying electric power has a risk of sparking at, for instance, turning on and off the measuring instrument. Hence, the measuring instrument itself needs to be tightly shielded for such use in the chemical industry, which leads to problems such as increases in the scale of an apparatus and in costs.

In the field of semiconductor manufacturing or another industry, semiconductor devices need to be protected from electrostatic damages to enhance yields. In such a field, the distribution of charge potential needs to be comprehended in a wide range. Using general measuring instruments having an electrode probe enables measurement of charge potential at a fixed point but has a problem in measuring the charge potential in a wide range and the amount of electric charges. In order to address such a problem, a technique in which a probe is moved in a planar manner (mechanically moved along the X-Y axis) to measure the distribution of charge potential has been suggested; however, it has the following problems: the measurement cannot be quickly carried out because the planar movement of the probe takes a time, mechanical contact resulting from the planar and mechanical movement may cause sparks, a structure is complicated and results in an increased cost and an enhancement in failure probability, and power consumption is increased for the measurement (see Japanese Unexamined Patent Application Publication No. 11-211771).

In view of such circumstances, a technique that enables charge potential to be easily comprehended has been highly demanded.

SUMMARY OF THE INVENTION

It is an object of the present invention to provide an electrostatic indicator that easily visualizes charge potential without external supply of electric power.

The inventors have intensively studied and found that using a liquid crystal composition enables production of an electrostatic indicator which can readily visualize the magnitude of charge potential and of which the simple structure very easily enables the electrostatic indicator to be not only placed at one position but also two-dimensionally or three-dimensionally placed to visualize the spatial distribution of high or low charge potential as well, thereby accomplishing the present invention.

DESCRIPTION OF THE PREFERRED EMBODIMENTS

An electrostatic indicator according to an embodiment of the present invention can easily visualize the magnitude of charge potential. The electrostatic indicator may be independently used, or multiple electrostatic indicators may be combined to form an apparatus. The electrostatic indicator may be in the form of a plate, a sheet, or a belt; when such an electrostatic indicator is placed, it may be in its original shape or may be cut in a size enough for the intended area.

Such use includes rolling a sheet- or belt-like electrostatic indicator for carrying and cutting the electrostatic indicator in a length appropriate to the place for installation.

Figure 1:
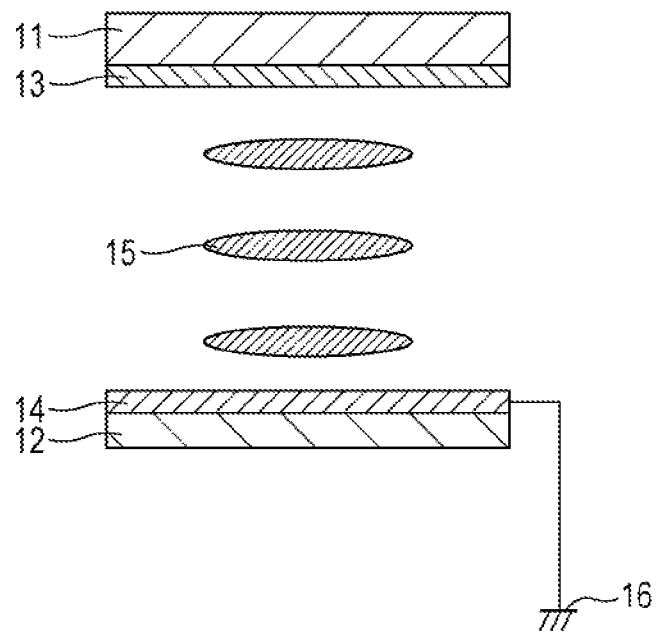
FIG. 1 schematically illustrates an example of the mechanism of an electrostatic indicator according to an embodiment of the present invention (case in which a charged object does not exist near the electrostatic indicator).
Figure 2:
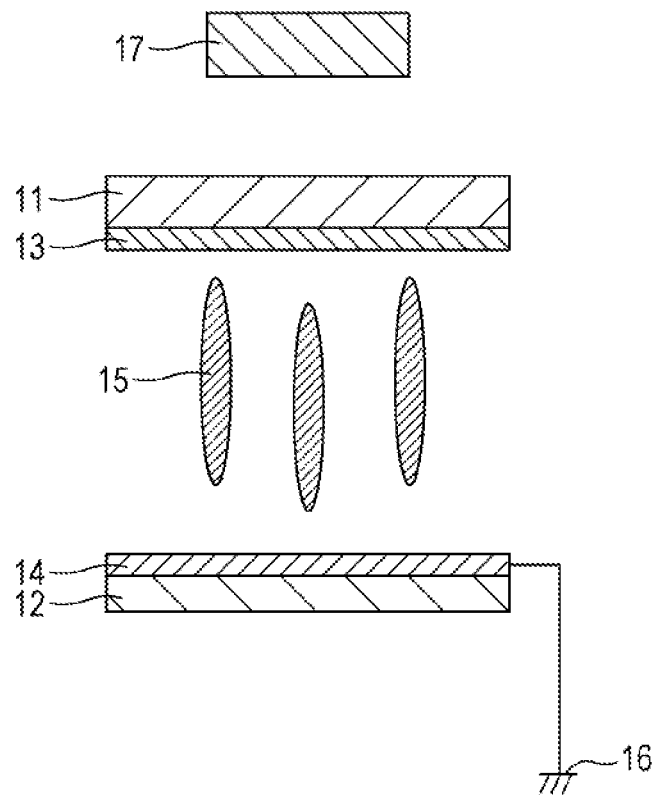
FIG. 2 schematically illustrates another example of the mechanism of the electrostatic indicator according to the embodiment of the present invention (case in which a charged object exists near the electrostatic indicator).

The electrostatic indicator has a basic structure in which a liquid crystal composition is disposed between two electrodes as illustrated in FIG. 1, and one of the electrodes is grounded (generally earthed) in an electric potential serving as reference. When a charged object that is to be analyzed exists near such an electrostatic indicator, electrostatic induction occurs in the non-grounded electrode, potential difference is therefore generated between the two substrates, and a change in the alignment of the molecules of the liquid crystal composition is induced as illustrated in FIG. 2 on the basis of the potential difference. Such a change in the molecular alignment is allowed to be seen as a visual change, thereby enabling the electrostatic indicator. The electrostatic indicator is preferably placed such that a charged object 17 faces a substrate 11 having an electrode 13 that is different from the grounded electrode. This can induce a change in alignment of the molecules of a liquid crystal composition 15. In order to visualize the magnitude of charge potential, the electrostatic indicator may have at least two regions having a difference in the degree of the change in the alignment of the molecules of the liquid crystal composition 15 at the same charge potential. Specific examples of a method for forming such regions include the following ones.

Figure 3:
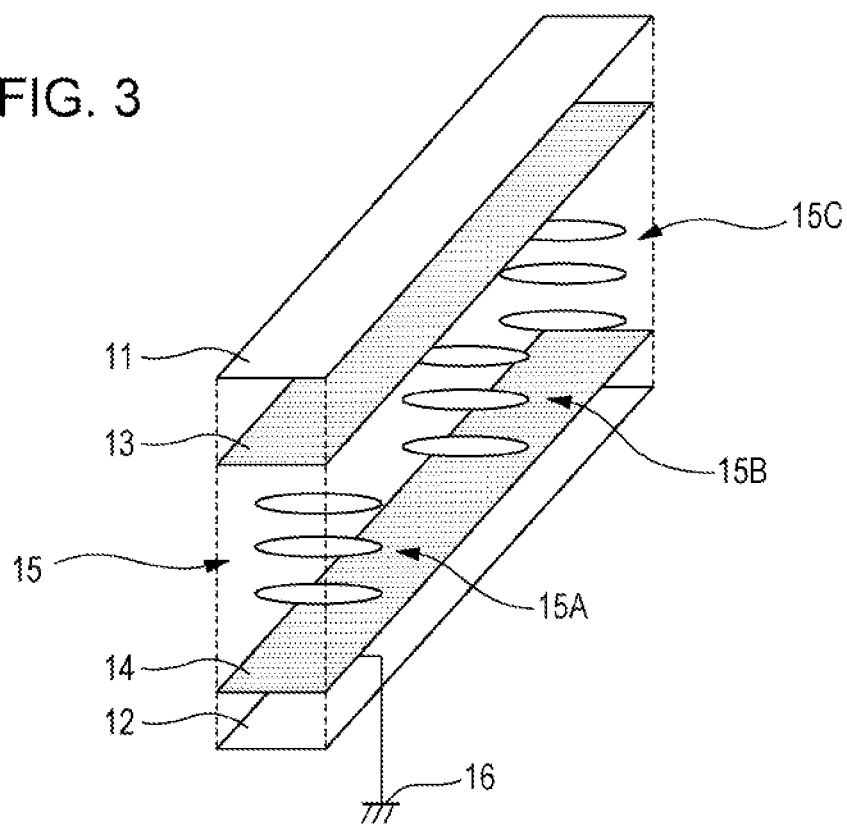
FIG. 3 schematically illustrates an example of the structure of the electrostatic indicator according to the embodiment of the present invention (case in which a liquid crystal has different dielectric anisotropies in the individual regions).

(1) Using liquid crystal compositions having different dielectric anisotropies ($\Delta\varepsilon$) in the individual regions
(2) Allowing liquid crystal layers in the individual regions including the liquid crystal composition to have different thicknesses
(3) Dividing voltage applied between the electrodes, namely potential difference generated by the electrostatic induction, with a resistor in the individual regions
(4) Allowing the electrodes, which will be described later, to be different from each other The method (1) is an example of the electrostatic indicator in which liquid crystal compositions having different $\Delta\varepsilon$ are used in the individual regions as illustrated in FIG. 3. Since the liquid crystal compositions in the individual regions have different $\Delta\varepsilon$ values (in the regions 15A, 15B, and 15C, different liquid crystal compositions having different $\Delta\varepsilon$ values are used), the regions have a difference in alignment of the molecules of the liquid crystal compositions even though the charge potential generated between the two electrodes (13 and 14) with the liquid crystal compositions interposed therebetween is the same in each of the regions. This phenomenon is utilized in the method (1). The larger the absolute value of $\Delta\varepsilon$ of the liquid crystal composition is, the larger the change in the molecular alignment due to electrostatic induction is. In other words, in the case where the alignment of the molecules of a liquid crystal composition having $\Delta\varepsilon$ with a small absolute value is changed, charge potential is high. To be exact, the degree of the change in molecular alignment due to charging is affected not only by the $\Delta\varepsilon$ of the liquid crystal composition but also by the elastic constant thereof; however, the material dependence of the elastic constant is generally not so high, and a material may be therefore determined in view of the absolute value of $\Delta\varepsilon$.

Figure 4:
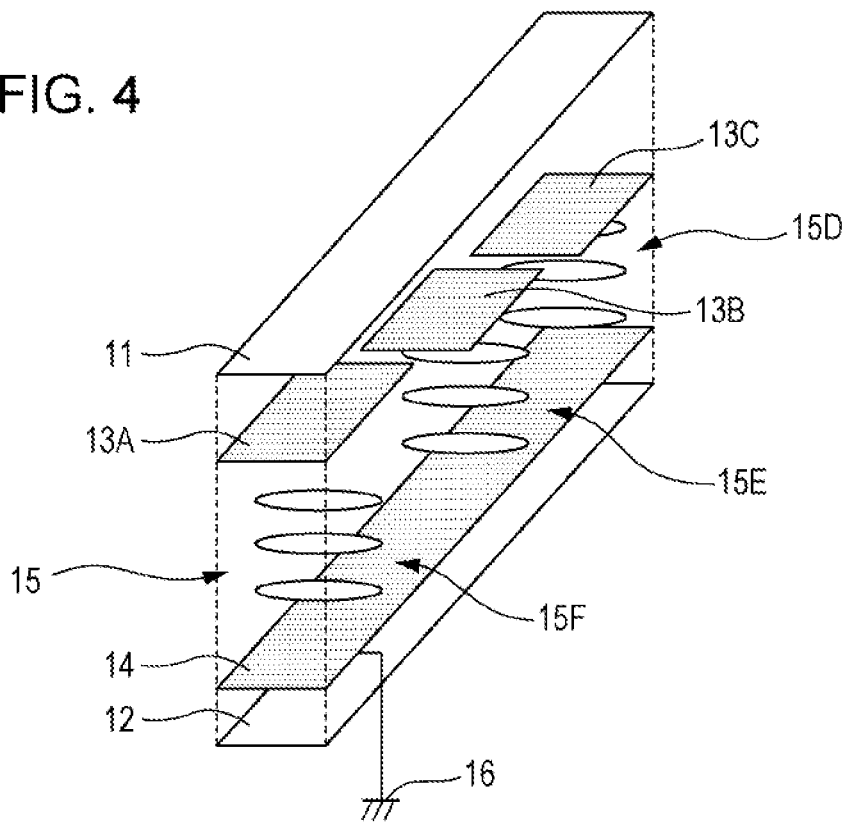
FIG. 4 schematically illustrates another example of the structure of the electrostatic indicator according to the embodiment of the present invention (case in which the liquid crystal has different thicknesses in the individual regions).

The method (2) is an example of the electrostatic indicator in which the liquid crystal composition has different thicknesses (d) in the individual regions as illustrated in FIG. 4. The difference in the thickness (d) causes different electric fields to be applied to the liquid crystal composition even though the potential difference between the two electrodes (13A and 14, 13B and 14, and 13C and 14) is the same in each of the regions. This phenomenon is utilized in the method (2). The smaller the thickness (d) is, the larger the change in the molecular alignment due to electrostatic induction is. The thickness (d) may be changed stepwise or straightly.

Figure 5:
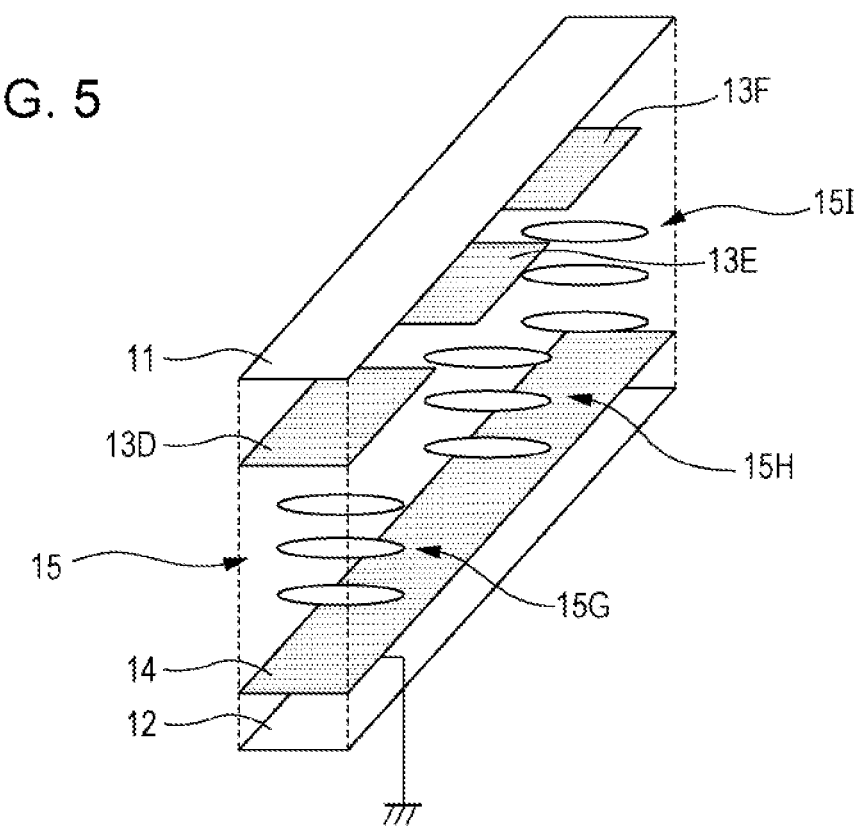
FIG. 5 schematically illustrates another example of the structure of the electrostatic indicator according to the embodiment of the present invention (case in which an electric field applied to the liquid crystal is divided in the individual regions).
Figure 6:
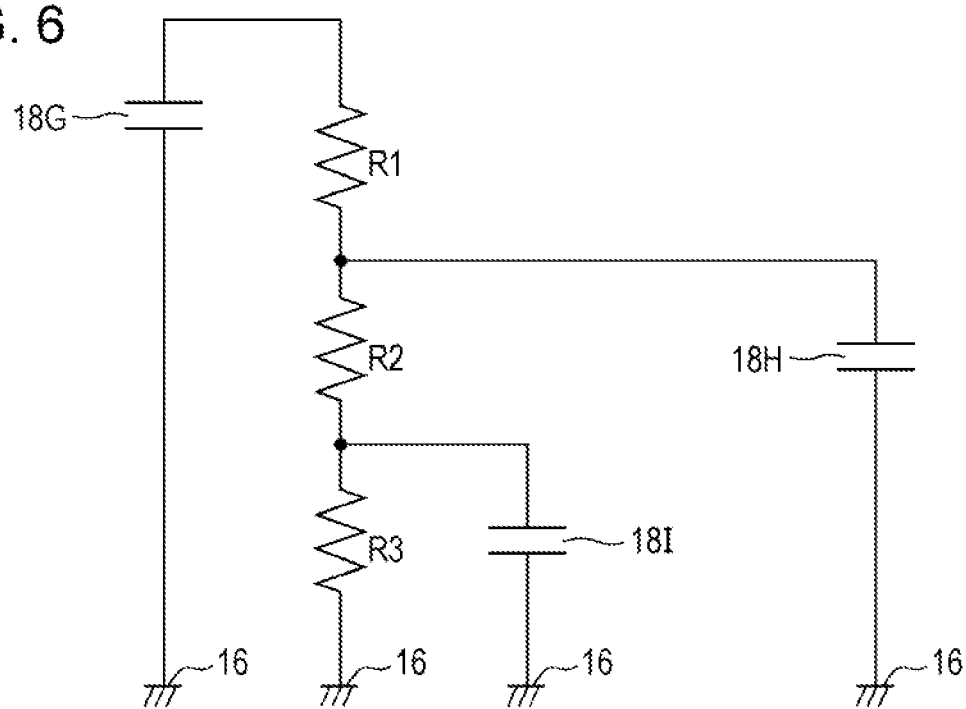
FIG. 6 illustrates an equivalent circuit in the example of the structure of the electrostatic indicator according to the embodiment of the present invention (case in which an electric field applied to the liquid crystal is divided in the individual regions).

In the method (3), voltage applied between the electrodes, namely potential difference generated by electrostatic induction, is divided with a resistor in the individual regions as illustrated in FIG. 5; and the individual regions therefore have different states of molecular alignment. This phenomenon is utilized in the method (3). FIG. 6 illustrates an equivalent circuit in FIG. 5. The liquid crystal composition is a dielectric and therefore serves as a capacitor when it is disposed between two electrodes. In particular, a liquid crystal composition (18G) disposed between an electrode 13D and a common electrode 14 in a region 15G, a liquid crystal composition (18H) disposed between an electrode 13E and the common electrode 14 in a region 15H, and a liquid crystal composition (18I) disposed between an electrode 13F and the common electrode 14 in a region 15I each serve as a capacitor. The electrode 13D is disposed such that only part thereof is exposed to the outside of the liquid crystal cell, so that only the electrode 13D is dielectrically charged. Furthermore, the electrode 13D is connected to resistors R1, R2, and R3 as illustrated in the equivalent circuit, so that potential difference generated by electrostatic induction in the region 15G can be divided and applied between the electrodes in the regions 15H and 15I. In the case where, for example, the resistors R1, R2, and R3 have the same resistance, two third of the potential difference in the region 15G is applied in the region 15H, and one third of the potential difference in the region 15G is applied in the region 15I. This mechanism enables a change in the alignment of the molecules of the liquid crystal composition 15 in the individual regions on the basis of the $\Delta\varepsilon$ value of the liquid crystal composition 15, which visualizes the amount of electric charges.

The method (4) is an example of the electrostatic indicator, in which an electrode is provided to a charged object side of the liquid crystal layer, another electrode is provided to the other side, and the material of the electrode provided to the charged object side is different from that of the electrode provided to the other side. This enables a dielectric effect to be partially changed.

In the electrostatic indicator, a liquid crystal composition is used. The alignment of the molecules of the liquid crystal composition is changed by static electricity, and this phenomenon is utilized to visualize the magnitude of charge potential. A method for visualizing the change in the alignment of the molecules of the liquid crystal composition may be either of the following ones: utilizing a change in a refractive index anisotropy ($\Delta n$) brought about by a change in the state of molecular alignment, utilizing a change in the state of polarization, controlling optical transmission and scattering, and a so-called guest-host technique in which a dye is added to the liquid crystal composition.

Liquid Crystal Composition

The liquid crystal composition to be used may be a p-type liquid crystal composition of which the refractive index anisotropy ($\Delta\varepsilon$) is positive or an n-type liquid crystal composition of which the $\Delta\varepsilon$ is negative. Such a liquid crystal composition can be an appropriate combination of compounds selected from compounds represented by General Formula (J), compounds represented by General Formula (N-1), and compounds represented by General Formula (L).

In the case where liquid crystal compositions having different Δε values are used, the absolute values thereof are practically from −10 to 20, and the difference in the Δε value is preferably 1 or more and 10 or less.

An unnecessarily small difference causes a problem in which detection of the magnitude of charge potential is too strict to be comprehensible, and an unnecessarily large difference causes problems in which the increased viscosity of the liquid crystal composition causes response speed to be slow and in which detection of the magnitude of charge potential is too approximate to be comprehensible.

The p-type liquid crystal composition preferably contains one of or two or more of compounds represented by General Formula (J). These compounds are dielectrically positive compounds (Δε value is greater than 2).

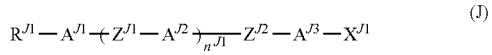
(J)

In General Formula (J), $R^{J1}$ represents an alkyl group having 1 to 8 carbon atoms; in the alkyl group, one $—CH_2—$ or two or more $—CH_2—$'s not adjoining each other are each independently optionally substituted with $—CH=CH—$, $—C\equiv C—$, $—O—$, $—CO—$, $—COO—$, or $—OCO—$;

$n^{J1}$ represents 0, 1, 2, 3, or 4;

$A^{J1}$, $A^{J2}$, and $A^{J3}$ each independently represent a group selected from the group consisting of (a) a 1,4-cyclohexylene group (in which one $—CH_2—$ or two or more $—CH_2—$'s not adjoining each other are optionally substituted with $—O—$), (b) a 1,4-phenylene group (in which one $—CH=$ or two or more $—CH=$'s not adjoining each other are optionally substituted with $—N=$), and (c) a naphthalene-2,6-diyl group, a 1,2,3,4-tetrahydronaphthalene-2,6-diyl group, or a decahydronaphthalene-2,6-diyl group (in the naphthalene-2,6-diyl group or the 1,2,3,4-tetrahydronaphthalene-2,6-diyl group, one $—CH=$ or two or more $—CH=$'s not adjoining each other are optionally substituted with $—N=$);

the groups (a) to (c) are each independently optionally substituted with a cyano group, a fluorine atom, a chlorine atom, a methyl group, a trifluoromethyl group, or trifluoromethoxy group;

$Z^{J1}$ and $Z^{J2}$ each independently represent a single bond, $—CH_2CH_2—$, $—(CH_2)_4—$, $—OCH_2—$, $—CH_2O—$, $—OCF_2—$, $—CF_2O—$, $—COO—$, $—OCO—$, or $—C\equiv C—$;

in the case where $n^{J1}$ is 2, 3, or 4 and where $A^2$ is multiple, the multiple $A^{J2}$'s may be the same as or different from each other; in the case where $n^{J1}$ is 2, 3, or 4 and where $Z^{J1}$ is multiple, the multiple $Z^{J1}$'s may be the same as or different from each other; and $X^{J1}$ represents a hydrogen atom, a fluorine atom, a chlorine atom, a cyano group, a trifluoromethyl group, a fluoromethoxy group, a difluoromethoxy group, a trifluoromethoxy group, or a 2,2,2-trifluoroethyl group.

The n-type liquid crystal composition preferably contains one of or two or more of compounds represented by General Formula (N-1). These compounds are dielectrically negative compounds (Δε is negative, and the absolute value thereof is greater than 2).

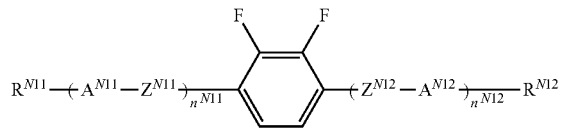
(N-1)

In General Formula (N-1), $R^{N11}$ and $R^{N12}$ each independently represent an alkyl group having 1 to 8 carbon atoms; in the alkyl group, one $—CH_2—$ or two or more $—CH_2—$'s not adjoining each other are each independently optionally substituted with $—CH=CH—$, $—C\equiv C—$, $—O—$, $—CO—$, $—COO—$, or $—OCO—$;

$A^{J1}$ and $A^{J2}$ each independently represent a group selected from the group consisting of (a) a 1,4-cyclohexylene group (in which one $—CH_2—$ or two or more $—CH_2—$'s not adjoining each other are optionally substituted with $—O—$), (b) a 1,4-phenylene group (in which one $—CH=$ or two or more $—CH=$'s not adjoining each other are optionally substituted with $—N=$), (c) a naphthalene-2,6-diyl group, a 1,2,3,4-tetrahydronaphthalene-2,6-diyl group, or a decahydronaphthalene-2,6-diyl group (in the naphthalene-2,6-diyl group or the 1,2,3,4-tetrahydronaphthalene-2,6-diyl group, one $—CH=$ or two or more $—CH=$'s not adjoining each other are optionally substituted with $—N=$), and (d) 1,4-cyclohexenylene group;

the groups (a) to (d) are each independently optionally substituted with a cyano group, a fluorine atom, or a chlorine atom;

$Z^{N11}$ and $Z^{N12}$ each independently represent a single bond, $—CH_2CH_2—$, $—(CH_2)_4—$, $—OCH_2—$, $—CH_2O—$, $—COO—$, $—OCO—$, $—OCF_2—$, $—CF_2O—$, $—CH=N—N=CH—$, $—CH=CH—$, $—CF=CF—$, or $—C\equiv C—$;

$n^{N11}$ and $n^{N12}$ each independently represent an integer from 0 to 3; $n^{N11}+n^{N12}$ is 1, 2, or 3; and in the case where $A^{N11}$ and $A^{N12}$ and $Z^{N11}$ and $Z^{N12}$ are individually multiple, the multiple $A^{N11}$'s, $A^{N12}$'s, $Z^{N11}$'s, and $Z^{N12}$'s may be individually the same as or different from each other.

The liquid crystal composition used in an embodiment of the present invention preferably contains one of or two or more of compounds represented by General Formula (L). The compound represented by General Formula (L) is a substantially dielectrically neutral compound (Δε value is from −2 to 2).

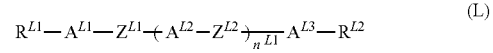
(L)

In General Formula (L), $R^{L1}$ and $R^{L2}$ each independently represent an alkyl group having 1 to 8 carbon atoms; in the alkyl group, one $—CH_2—$ or two or more $—CH_2—$'s not adjoining each other are each independently optionally substituted with $—CH=CH—$, $—C\equiv C—$, $—O—$, $—CO—$, $—COO—$, or $—OCO—$;

$n^{L1}$ represents 0, 1, 2, or 3;

$A^{L1}$, $A^{L2}$, and $A^{L3}$ each independently represent a group selected from the group consisting of (a) a 1,4-cyclohexylene group (in which one $—CH_2—$ or two or more $—CH_2—$'s not adjoining each other are optionally substituted with $—O—$), (b) a 1,4-phenylene group (in which one —CH= or two or more —CH='s not adjoining each other are optionally substituted with —N=), and (c) a naphthalene-2,6-diyl group, a 1,2,3,4-tetrahydronaphthalene-2,6-diyl group, or a decahydronaphthalene-2,6-diyl group (in the naphthalene-2,6-diyl group or the 1,2,3,4-tetrahydronaphthalene-2,6-diyl group, one —CH= or two or more —CH='s not adjoining each other are optionally substituted with —N=);

the groups (a) to (c) are each independently optionally substituted with a cyano group, a fluorine atom, or a chlorine atom;

$Z^{L1}$ and $Z^{L2}$ each independently represent a single bond, —CH$_2$CH$_2$—, —(CH$_2$)$_4$—, —OCH$_2$—, —CH$_2$O—, —COO—, —OCO—, —OCF$_2$—, —CF$_2$O—, —CH=N—N=CH—, —CH=CH—, —CF=CF—, or —C≡C—;

in the case where $n^{L1}$ is 2 or 3 and where $A^{L2}$ is multiple, the multiple $A^{L1}$'s may be the same as or different from each other; in the case where $n^{L1}$ is 2 or 3 and where $Z^{L2}$ is multiple, the multiple $Z^{L2}$'s may be the same as or different from each other; and the compounds represented by General Formula (L) exclude the compounds represented by General Formulae (N-1) and (J).

The composition preferably has a liquid crystal phase, and more preferably a nematic phase at room temperature (25° C.).

Such compounds can be used in any combination; a proper combination of the compounds is determined on the basis of predetermined properties such as solubility at low temperature, transition temperature, electric reliability, and birefringence. In an embodiment of the present invention, for example, one, two, or three of such compounds are used. In another embodiment of the present invention, four, five, six, or seven or more of the compounds are used.

In order to enhance sensitivity, it is preferred that the absolute value of the Δε of the liquid crystal composition be high and that the viscosity (η) of the liquid crystal composition be low. In order to increase the absolute value of Δε, the compounds represented by General Formulae (N-1) and (J) are preferably used in a larger amount; in order to decrease η, the compound represented by General Formula (L) is preferably used in a larger amount.

In order to enhance the speed at which the molecular alignment returns to the initial state when the charge potential of an object that is to be analyzed decreases, it is preferred that the voltage holding ratio of the liquid crystal composition be not so high. In this case, a cyano group is preferably employed as a polar substituent to the groups (a), (b), and (c) in General Formulae (J) and (N-1). Specifically, the voltage holding ratio is preferably in the range of 20 to 95%, more preferably 40 to 90%, and especially preferably 50 to 80% when the voltage holding ratio of a liquid crystal composition put into a liquid crystal cell having a cell gap of 5 μm is measured at room temperature (25° C.), a driving voltage of 5 V, a frame time of 16.6 ms, and a voltage-applied time of 64 μs. In order to enhance the speed at which the molecular alignment returns to the initial state when the charge potential of an object that is to be analyzed decreases, it is also preferred the specific resistance of the liquid crystal composition be not so high. Also in this case, a cyano group is preferably employed as a polar substituent to the groups (a), (b), and (c) in General Formulae (J) and (N-1). Specifically, the specific resistance is preferably in the range of $1\times10^7$ to $1\times10^{12}$ Ω·cm, more preferably $1\times10^8$ to $1\times10^{11}$ Ω·cm, and especially preferably $5\times10^8$ to $5\times10^{10}$ Ω·cm at 25° C.

In the case where the electrostatic indicator retains and memorizes the occurrence of charging and analyzes the charged state at that moment later on even when the charge potential of an object that is to be analyzed decreases, it is preferred that the liquid crystal composition have a high voltage holding ratio. In this case, a fluorine atom, a chlorine atom, a trifluoromethyl group, a fluoromethoxy group, a difluoromethoxy group, a trifluoromethoxy group, or a 2,2,2-trifluoroethyl group is preferably employed as a polar substituent to the groups (a), (b), and (c) in General Formulae (J) and (N-1); and a fluorine atom is more preferably employed. Specifically, the voltage holding ratio is preferably 95% or more, more preferably 97% or more, and especially preferably 99% or more when the voltage holding ratio of a liquid crystal composition put into a liquid crystal cell having a cell gap of 5 μm is measured at room temperature (25° C.), a driving voltage of 5 V, a frame time of 16.6 ms, and a voltage-applied time of 64 μs. In the case where the electrostatic indicator retains and memorizes the occurrence of charging and analyzes the charged state at that moment later on even when the charge potential of an object that is to be analyzed decreases, it is also preferred that the liquid crystal composition have a high specific resistance. Also in this case, a fluorine atom, a chlorine atom, a trifluoromethyl group, a fluoromethoxy group, a difluoromethoxy group, a trifluoromethoxy group, or a 2,2,2-trifluoroethyl group is preferably employed as a polar substituent to the groups (a), (b), and (c) in General Formulae (J) and (N-1); and a fluorine atom is more preferably employed.

Specifically, the specific resistance is preferably $1\times10^{12}$ Ω·cm or more, more preferably $1\times10^{13}$ Ω·cm or more, and especially preferably $1\times10^{14}$ Ω·cm or more.

The thickness of the liquid crystal layer is preferably in the range of 3 to 100 μm, and more preferably 5 to 50 μm.

In the case where the liquid crystal layer exists in multiple regions and has different thicknesses, the rate of a difference in the thickness is preferably in the range of 20% to 100%. When the rate of a difference in the thickness is less than 20%, detection of the magnitude of charge potential is too strict to be comprehensible; when the rate of a difference in the thickness is greater than 100%, detection of the magnitude of charge potential is too approximate to be comprehensible.

In the case where a dye is added to the liquid crystal composition, a dichroic dye that is generally used can be suitably employed. The dichroic dye is preferably an azo dye or an anthraquinone dye. Addition of the dye eliminates use of a polarizing plate that will be described later, which enables an apparatus to have a simple structure. Thus, adding the dye is preferred. Examples of the dichroic dye include SI-486 (yellow), SI-426 (red), M-483 (blue), M-412 (blue), M-811 (blue), S-428 (black), and M-1012 (black) each manufactured by Mitsui Fine Chemicals, Inc and LSY-116 (yellow), LSR-401 (magenta), LSR-406 (red), LSR-426 (purple), LSB-278 (blue), LSB-350 (blue), and LSR-426 (cyan) each manufactured by Mitsubishi Chemical Corporation.

In the electrostatic indicator in which optical transmission and scattering are controlled, the liquid crystal composition is preferably so-called polymer-dispersed liquid crystal. The polymer-dispersed liquid crystal can be produced by using a liquid crystal composition to which a polymerizable compound has been added such that the liquid crystal composition is dispersed in the polymer chain and then curing the polymerizable compound.

Substrate

A usable substrate in the electrostatic indicator according to an embodiment of the present invention is suitably a substrate that is generally used in liquid crystal devices, displays, optical components, and optical films. Examples of such a substrate include glass substrates, metal substrates, ceramic substrates, and substrates formed of organic materials, such as plastic substrates. Especially in the case where the substrate is formed of an organic material, examples of the organic material include cellulose derivatives, polyolefin, polyester, polycarbonate, polyacrylate, polyarylate, polyether sulphone, polyimide, polyphenylene sulfide, polyphenylene ether, nylon, and polystyrene. In particular, plastic substrates formed of polyester, polystyrene, polyolefin, cellulose derivatives, polyarylate, and polycarbonate are preferred. The substrate may have a planar shape or a curved surface. Such a substrate may optionally have an electrode layer, an antireflection function, or a reflection function. At least the substrate existing between the liquid crystal composition and an observer is preferably transparent.

The substrate preferably has a flexibility. The substrate having a flexibility enables the electrostatic indicator to be rolled when it is carried and also to be bent on the basis of the shape of an object subjected to detection of static electricity and the shape of a place to which the electrostatic indicator is attached. Such a substrate is preferred.

Electrode

The electrode may be single or a combination of two or more electrodes. In the case where the electrode is single, the electrode is preferably grounded. In the case where multiple electrodes are used, at least one of them is preferably grounded. When multiple electrodes are used, one electrode may be grounded, and multiple non-grounded electrodes may be provided opposite to the grounded electrode; alternatively, one non-grounded electrode may be provided, and multiple grounded electrodes may be provided opposite to the non-grounded electrode.

In the electrostatic indicator having two substrates with the liquid crystal composition interposed therebetween, one of the substrates may have a grounded electrode, and the other one may have a non-grounded electrode; alternatively, only one of the substrates may have both grounded electrode and a non-grounded electrode. It is preferred that one of the substrates have a grounded electrode and that the other one have a non-grounded electrode.

In the case where potential difference generated by electrostatic induction is divided with a resistor in multiple regions, the resistor may be provided outside the electrostatic indicator, or the specific pattern of the electrode may be formed to use part of the electrode as the resistor. It is preferred that the specific pattern of the electrode be formed to use part of the electrode as the resistor because the resistor does not need to be externally provided; for example, the electrode is formed so as to partially have a very small width, or the electrode is formed in a zigzag pattern to have a long length. The resistor for dividing potential difference is preferably 1 MΩ or more, and also preferably 5 MΩ or more. At less than 1 MΩ, the potential difference generated by electrostatic induction is likely to quickly disappear.

In the electrostatic indicator according to an embodiment of the present invention, the material used for forming a transparent electrode can be a conductive metal oxide. Usable metal oxides are indium oxide ($In_2O_3$), tin oxide ($SnO_2$), zinc oxide (ZnO), indium tin oxide ($In_2O_3$—$SnO_2$), indium zinc oxide ($In_2O_3$—ZnO), niobium-doped titanium dioxide ($Ti_{1-x}Nb_xO_2$), fluorine-doped tin oxide, graphene nanoribbon, and metal nanowires; among these, zinc oxide (ZnO), indium tin oxide ($In_2O_2$—$SnO_2$), and indium zinc oxide ($In_2O_3$—ZnO) are preferred. A transparent conductive film formed of any of such materials can be patterned by photo-etching or a technique involving use of a mask. At least the electrode existing between the liquid crystal composition and an observer is preferably transparent.

Alignment of Molecules of Liquid Crystal Composition

The molecules of the liquid crystal composition may be substantially in the state of vertical alignment or horizontal alignment to the substrate when the potential difference between the grounded electrode and the non-grounded electrode is substantially 0 V. In the case where the p-type liquid crystal composition is used, horizontal alignment is preferred; in the case where the n-type liquid crystal composition is used, vertical alignment is preferred.

Alignment Treatment

The substrate may be subjected to an alignment treatment or may be provided with an alignment film in order to control the alignment of the molecules of the liquid crystal composition. Examples of the alignment treatment include a stretching treatment, a rubbing treatment, a treatment with radiation of polarized ultraviolet or visible light, an ion beam treatment, and oblique deposition of $SiO_2$ on the substrate. In the case where an alignment film is used, any of known alignment films can be employed. Examples of such alignment films include those formed of compounds, such as polyimide, polysiloxane, polyamide, polyvinyl alcohol, polycarbonate, polystyrene, polyphenylene ether, polyarylate, polyethylene terephthalate, polyether sulfone, epoxy resins, epoxyacrylate resins, acrylic resins, coumarin compounds, chalcone compounds, cinnamate compounds, fulgide compounds, anthraquinone compounds, azo compounds, and arylethene compounds. A compound that is to be rubbed for the alignment treatment is preferably a compound of which the crystallization of the material is promoted by the alignment treatment itself or heating after the alignment treatment. Among compounds that are to be subjected to the alignment treatment other than the rubbing, photo-aligned materials are preferably used.

In general formation of alignment films, the above-mentioned material of the alignment films is applied onto substrates by spin coating or another technique to form resin films; besides, uniaxial stretching or a Langmuir-Blodgett technique can be employed.

The material used for forming the alignment film may be an optically anisotropic body (positive A plate) produced by polymerization of the polymerizable liquid crystal composition that is in homogeneous alignment, and the alignment film may be in the form of a horizontal alignment film. Alternatively, an optically anisotropic body (positive C plate) produced by polymerization of the polymerizable liquid crystal composition that is in homeotropic alignment may be used as a vertical alignment film.

Polarizing Plate

The change in the alignment of the molecules of the liquid crystal composition can be visualized with a polarizing plate without use of the dichromic dye. The polarizing plate can be disposed so as to give a normally white mode or normally black mode of general liquid crystal devices through adjusting the alignment of the molecules of the liquid crystal composition or installation of the polarizing plate. Any of polarizing plates can be suitably used provided that it can be used in general liquid crystal display devices.

Color Filter

The electrostatic indicator according to an embodiment of the present invention may have a color filter. The color filter includes a black matrix and pixels of at least three colors of RGB. A layer of the color filter may be formed by any technique. In an example of formation of the color filter, a colored composition that contains a pigment support and a color pigment dispersed in the pigment support is applied into a predetermined pattern, the pattern is cured to form a colored pixel, and this process is repeated necessary times to form a layer of the color filter. The pigment contained in the colored composition can be an organic pigment and/or an inorganic pigment. The colored composition may contain one organic or inorganic pigment and may contain multiple different organic pigments and/or inorganic pigments. The pigment is preferably highly chromogenic and thermally resistant, particularly resistant to thermal decomposition. In general, an organic pigment is used.

Ground

In the electrostatic indicator according to an embodiment of the present invention, the higher the charge potential of an object that is to be analyzed is, the higher the dielectric charge potential generated in the non-grounded electrode is; thus, the degree of a change in the alignment of the molecules of the liquid crystal composition becomes large, which makes visualization of charge potential being possible.

In an embodiment, for instance, in which a pair of electrodes are used as illustrated in FIGS. 1 and 2 and in which only one of the electrodes is grounded, dielectric induction is generated on the basis of the charge potential of an object that is to be analyzed, and potential difference is therefore caused between the grounded electrode and the non-grounded electrode. Such a potential difference changes the alignment of the molecules of the liquid crystal composition disposed between the electrodes, which makes the visualization of the amount of electric charges being possible (FIGS. 1 and 2 illustrate an example in which a liquid crystal composition having a positive dielectric anisotropy is used).

The ground may be provided at any position set to be a reference potential point. The ground may be provided, for example, by directly establishing the conductive connection of an electrode with a reference potential portion or by establishing the conductive connection of an electrode with a reference potential portion with a conductor such as a copper wire.

EXAMPLES

The present invention will now be described further in detail with reference to Examples but are not limited thereto. The term "%" refers to "mass %" in the following description of compositions in Examples and Reference Examples.

In Examples, the following properties were measured.

$T_{ni}$: Nematic phase-isotropic liquid phase transition temperature (° C.)

Δn: Refractive index anisotropy at 298 K

Δε: Dielectric anisotropy at 298 K

η: Viscosity at 293 K (mPa·s)

$γ_1$: Rotational viscosity at 298 K (mPa·s)

VHR: Voltage holding ratio (%) at 333 K, a frequency of 60 Hz, and an applied voltage of 5 V In Examples, compounds are abbreviated as follows.

Ring Structures

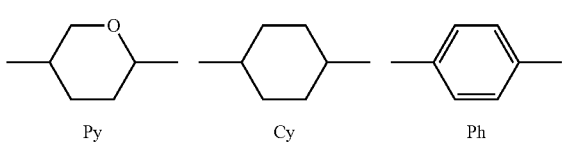

Py    Cy    Ph

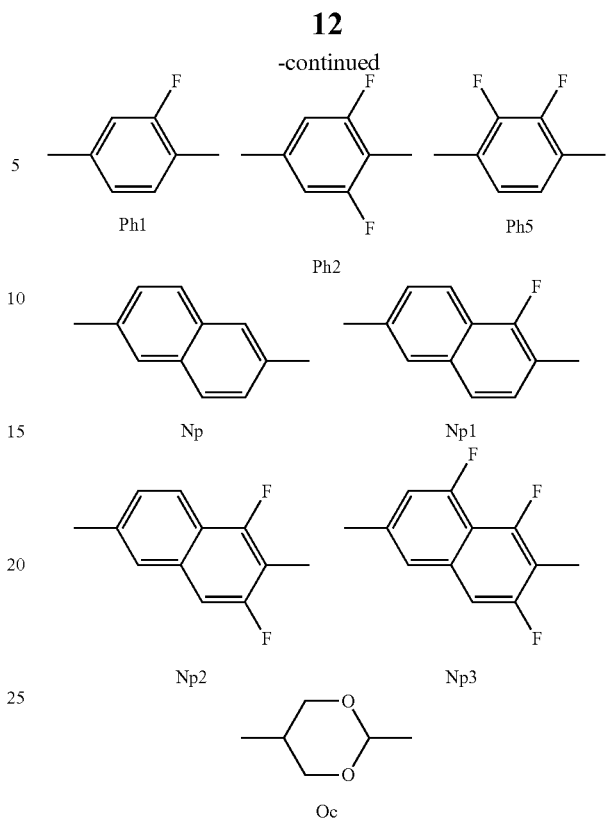

Side Chains and Linking Groups

TABLE 1

| | Side Chains |
|---|---|
| -n | —$C_nH_{2n+1}$ linear alkyl group having n carbon atoms |
| n- | $C_nH_{2n+1}$— linear alkyl group having n carbon atoms |
| -On | —$OC_nH_{2n+1}$ linear alkoxyl group having n carbon atoms |
| nO- | $C_nH_{2n+1}$O— linear alkoxyl group having n carbon atoms |
| -V | —CH=$CH_2$ |
| V- | $CH_2$=CH— |
| -V1 | —CH=CH—$CH_3$ |
| 1V- | $CH_3$—CH=CH— |
| -2V | —$CH_2$—$CH_2$—CH=$CH_2$ |
| V2- | $CH_2$=CH—$CH_2$—$CH_2$— |
| -2V1 | —$CH_2$—$CH_2$—CH=CH—$CH_3$ |
| 1V2- | $CH_3$—CH=CH—$CH_2$—$CH_2$— |
| | Linking Groups |
| -CFFO- | —$CF_2$—O— |
| -OCFF- | —O—$CF_2$— |
| -1O- | —$CH_2$—O— |
| -O1- | —O—$CH_2$— |
| -COO- | —COO— |
| -OCO- | —OCO— |

Reference Example 1: Preparation of Composition N3

A composition N3 shown in the below table was prepared.

TABLE 2

| Compounds | Concentration (%) |
|---|---|
| 3-Cy-Cy-V1 | 12 |
| 3-Cy-Cy-2 | 16 |
| 1V-Cy-Cy-1O-Ph5-O2 | 6 |
| 1-Ph-2-Ph-Ph5-O2 | 4 |

TABLE 2-continued

| Compounds | Concentration (%) |
| --- | --- |
| 3-Ph-2-Ph-Ph5-O2 | 6 |
| 3-Cy-Ph5-O2 | 13 |
| 3-Ph-Ph5-O2 | 13 |
| 2-Cy-Cy-Ph5-O2 | 7 |
| 3-Cy-Cy-Ph5-O2 | 7 |
| 2-Cy-Ph-Ph5-O2 | 8 |
| 3-Cy-Ph-Ph5-O2 | 8 |

The composition N3 had a $T_{ni}$ of 76° C., Δn of 0.114, Δε of −4.4, $\gamma_1$ of 117 mPa·s, VHR of 99.5%, and specific resistance of $1\times10^{13}$ Ω·cm or more.

Reference Example 2: Preparation of Composition N6

A composition N6 shown in the below table was prepared.

TABLE 3

| Compounds | Concentration (%) |
| --- | --- |
| 3-Cy-Cy-V | 29 |
| 3-Cy-Cy-V1 | 6 |
| 3-Cy-Ph-O1 | 14 |
| 3-Cy-Ph-Ph-2 | 6 |
| 5-Cy-Ph-Ph-2 | 6 |
| 3-Cy-1O-Ph5-O2 | 8 |
| 2-Cy-Cy-1O-Ph5-O2 | 7 |
| V-Cy-Cy-1O-Ph5-O2 | 5 |
| 1V-Cy-Cy-1O-Ph5-O2 | 7 |
| 3-Ph-2-Ph-Ph5-O2 | 12 |

The composition N6 had a $T_{ni}$ of 75° C., Δn of 0.098, and Δε of −2.3.

Reference Example 3: Preparation of Composition N7

A composition N7 in which the composition N3 and the composition N6 had been mixed with each other in the same mass was prepared. The composition N7 had a $T_{ni}$ of 76° C., Δn of 0.106, and Δε of −3.3.

Reference Example 4: Preparation of Composition N3R

A composition N3R was prepared by adding 1 mass % of a dichroic dye SI-426 manufactured by Mitsui Fine Chemicals to the compound N3 prepared in Reference Example 1.

Reference Example 5: Preparation of Composition N6R

A composition N6R was prepared by adding 1 mass % of a dichroic dye SI-426 manufactured by Mitsui Fine Chemicals to the compound N6 prepared in Reference Example 2.

Reference Example 6: Preparation of Composition N7R

A composition N7R was prepared by adding 1 mass % of a dichroic dye SI-426 manufactured by Mitsui Fine Chemicals to the compound N7 prepared in Reference Example 3.

Example 1

Figure 7:
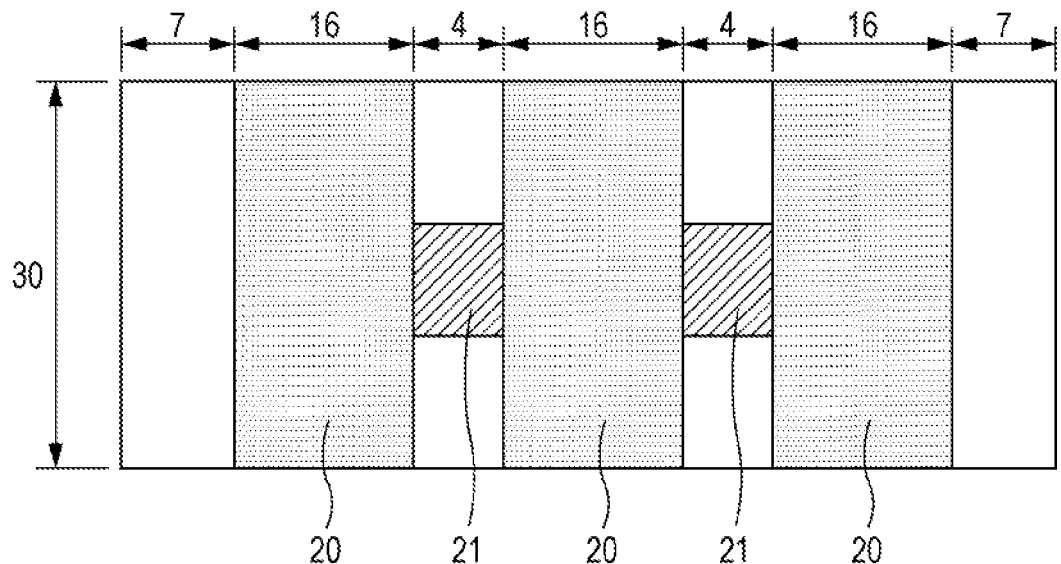
FIG. 7 illustrates an ITO pattern.
Figure 8:
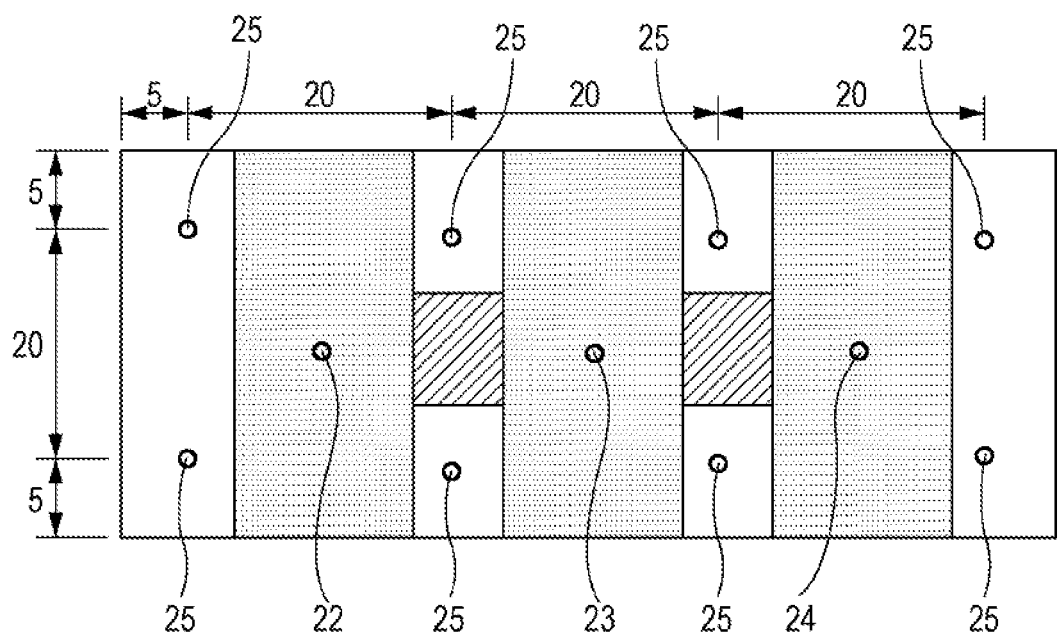
FIG. 8 illustrates the positions to which a liquid crystal composition and an adhesive are dropped.
Figure 9:
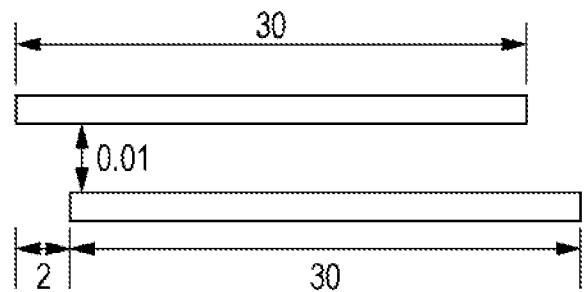
FIG. 9 illustrates the positions of an ITO-patterned substrate and ITO-solid substrate.
Figure 10:
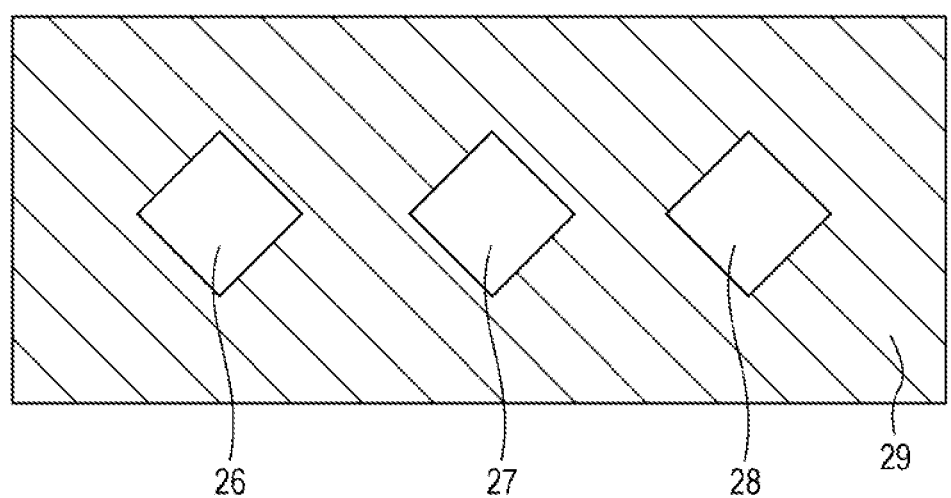
FIG. 10 illustrates the appearance of an electrostatic indicator according to an embodiment of the present invention.

A PET film substrate having a width of 3 cm, a length of 7 cm, a thickness of 50 μm, and a solid pattern of an ITO transparent electrode and a PET film substrate having a width of 3 cm, a length of 7 cm, a thickness of 50 μm, and a patterned ITO transparent electrode as illustrated in FIG. 7 (ITO transparent electrodes 20 were bonded to each other via ITO bonding parts 21) were prepared. A polyimide vertical alignment film was formed on each of the substrates having the ITO transparent electrode. As illustrated in FIG. 8, 0.8 mg of the compositions N3R, N6R, and N7R were separately dropped to 3 parts (liquid crystal composition dropped parts 22, 23, and 24) of the substrate illustrated in FIG. 7; and 3.1 mg of an ultraviolet curable adhesive 3052B manufactured by ThreeBond Co., Ltd. was dropped to 8 parts (adhesive dropped parts 25). In this state, the PET film having the solid electrode was attached thereto such that the electrode sides faced each other, and then pressure was applied to the entire surface. In this procedure, the films were attached to each other so as to be offset by 2 mm in the width direction as illustrated in FIG. 9 but not to be offset in the length direction. The distance between the two film substrates was 10 μm. The resulting product was irradiated with ultraviolet light having a wavelength of 365 nm at 300 mJ/cm² to cure the ultraviolet curable adhesive. Through this process, an electrostatic indicator according to an embodiment of the present invention, which had appearance illustrated in FIG. 10, was produced. A copper wire was bonded to the solid electrode to establish ground. In the produced device, the individual liquid crystal regions were surrounded by the insulating resin layer of the cured adhesive. The molecules of the liquid crystal compositions were in vertical alignment to the substrate without an external stimulus, and the molecular alignment was changed by an external stimulus. A Van de Graaff static electricity generator (its charged part) was placed so as to be spaced apart from the electrostatic indicator by 15 cm. When the Van de Graaff static electricity generator was in an off-mode, all of the three liquid crystal parts were transparent. When the Van de Graaff static electricity generator was turned on and charged to approximately 2 kV, only one of the three liquid crystal parts of the electrostatic indicator, which corresponded to the composition N3R, turned into deep red. In this state, the charged part of the Van de Graaff static electricity generator was moved and placed so as to be spaced apart from the electrostatic indicator by 10 cm, and then the liquid crystal part corresponding to the composition N7R turned into deep red in addition to the liquid crystal part corresponding to the composition N3R. Furthermore, the charged part of the Van de Graaff static electricity generator was moved and placed so as to be spaced apart from the electrostatic indicator by 5 cm, and then the liquid crystal part corresponding to the composition N6R turned into deep red in addition to the liquid crystal parts corresponding to the compositions N3R and N7R. As the electrostatic indicator became closer to the charged part of the Van de Graaff static electricity generator, the charge potential became higher. In response to an increase in the charge potential, liquid crystal parts including liquid crystal compositions having a dielectric anisotropy with a small absolute value turned into red stepwise, which shows that the electrostatic indicator according to an embodiment of the present invention enabled the magnitude of charging to be easily comprehended.

Example 2

Figure 11:
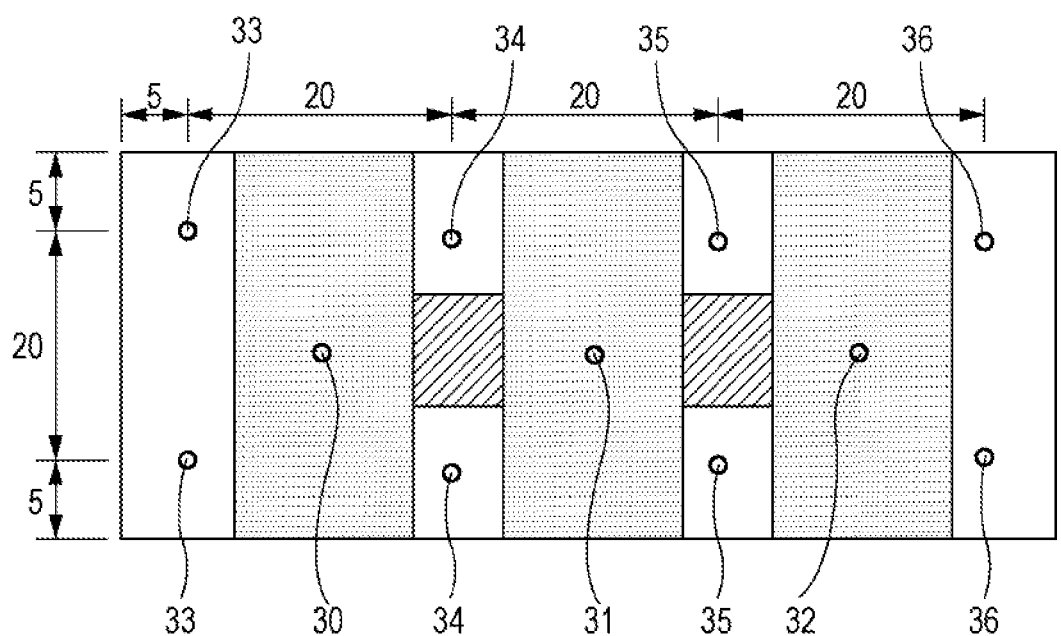
FIG. 11 illustrates the positions to which a liquid crystal composition and an adhesive are dropped.
Figure 12:
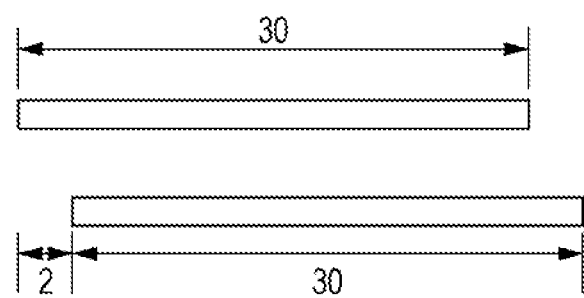
FIG. 12 illustrates the positions of an ITO-patterned substrate and ITO-solid substrate (in the width direction of substrates).
Figure 13:
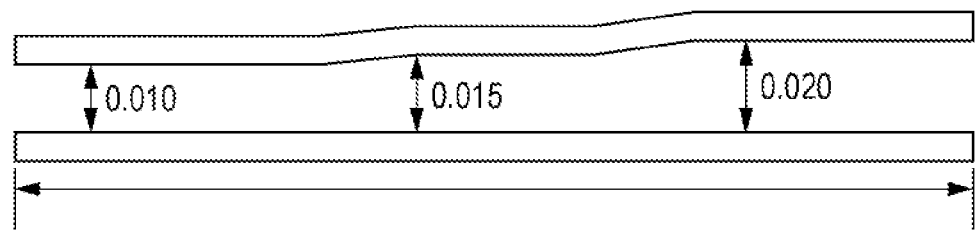
FIG. 13 illustrates the positions of the ITO-patterned substrate and ITO-solid substrate (in the length direction of the substrates).
Figure 14:
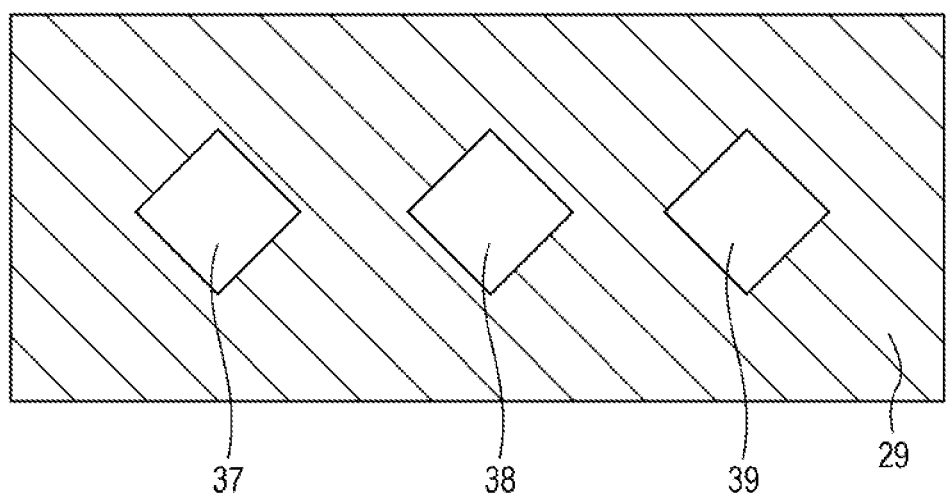
FIG. 14 illustrates the appearance of an electrostatic indicator according to an embodiment of the present invention.

A PET film substrate having a width of 3 cm, a length of 7 cm, a thickness of 50 μm, and a solid pattern of an ITO transparent electrode and a PET film substrate having a width of 3 cm, a length of 7 cm, a thickness of 50 μm, and a patterned ITO transparent electrodes as illustrated in FIG. 7 were prepared. A polyimide vertical alignment film was formed on each of the substrates having the ITO transparent electrode. As illustrated in FIG. 11, 0.8 mg of the composition N3R was dropped to a liquid crystal dropped part 30 of the substrate illustrated in FIG. 7, 1.2 mg of the composition N3R was dropped to a liquid crystal dropped part 31, 1.6 mg of the composition N3R was dropped to a liquid crystal dropped part 32, 3.1 mg of an ultraviolet curable adhesive 3052B manufactured by ThreeBond Co., Ltd. was dropped to an adhesive dropped parts 33, 4.1 mg of the adhesive was dropped to adhesive dropped parts 34, 5.2 mg of the adhesive was dropped to adhesive dropped parts 35, and 6.2 mg of the adhesive was dropped to adhesive dropped parts 36. In this state, the PET film having the solid electrode was attached thereto such that the electrode sides faced each other, and then pressure was applied to the entire surface. In this procedure, the films were attached to each other so as to be offset by 2 mm in the width direction but not to be offset in the length direction as illustrated in FIGS. 12 and 13. The amounts of the dropped liquid crystal composition and adhesive were adjusted to give the following distance between the two film substrates: 10 μm near the liquid crystal dropped parts 33 (region 37 in which the thickness of the layer of the liquid crystal composition N3R was 10 μm), 15 μm near the liquid crystal dropped parts 34 (region 38 in which the thickness of the layer of the liquid crystal composition N3R was 15 μm), and 20 μm near the liquid crystal dropped parts 35 (region 39 in which the thickness of the layer of the liquid crystal composition N3R was 20 μm). The resulting product was irradiated with ultraviolet light having a wavelength of 365 nm at 300 mJ/cm² to cure the ultraviolet curable adhesive. Through this process, an electrostatic indicator according to an embodiment of the present invention, which had appearance illustrated in FIG. 14, was produced. A copper wire was bonded to the common electrode to establish ground. A Van de Graaff static electricity generator (its charged part) was placed so as to be spaced apart from the electrostatic indicator by 15 cm. When the Van de Graaff static electricity generator was in an off-mode, all of the three liquid crystal parts were transparent. When the Van de Graaff static electricity generator was turned on and charged to approximately 2 kV, only the liquid crystal part in which the thickness of the liquid crystal layer was 10 μm (region 37 in which the thickness of the layer of the liquid crystal composition N3R was 10 μm) turned into deep red among the three liquid crystal parts of the electrostatic indicator. The charged part of the Van de Graaff static electricity generator was gradually moved closer to the electrostatic indicator, and then the liquid crystal part in which the thickness of the liquid crystal layer was 15 μm (region 38 in which the thickness of the layer of the liquid crystal composition N3R was 15 μm) also turned into deep red. Furthermore, the charged part of the Van de Graaff static electricity generator was further moved closer to the electrostatic indicator, and then the liquid crystal part in which the thickness of the liquid crystal layer was 20 μm (region 39 in which the thickness of the layer of the liquid crystal composition N3R was 20 μm) also turned into deep red. As the electrostatic indicator became closer to the charged part of the Van de Graaff static electricity generator, the charge potential became higher. In response to an increase in the charge potential, liquid crystal parts of which the layers had a larger thickness turned into red stepwise, which shows that the electrostatic indicator according to an embodiment of the present invention enabled the magnitude of charging to be easily comprehended.

Example 3

Figure 15:
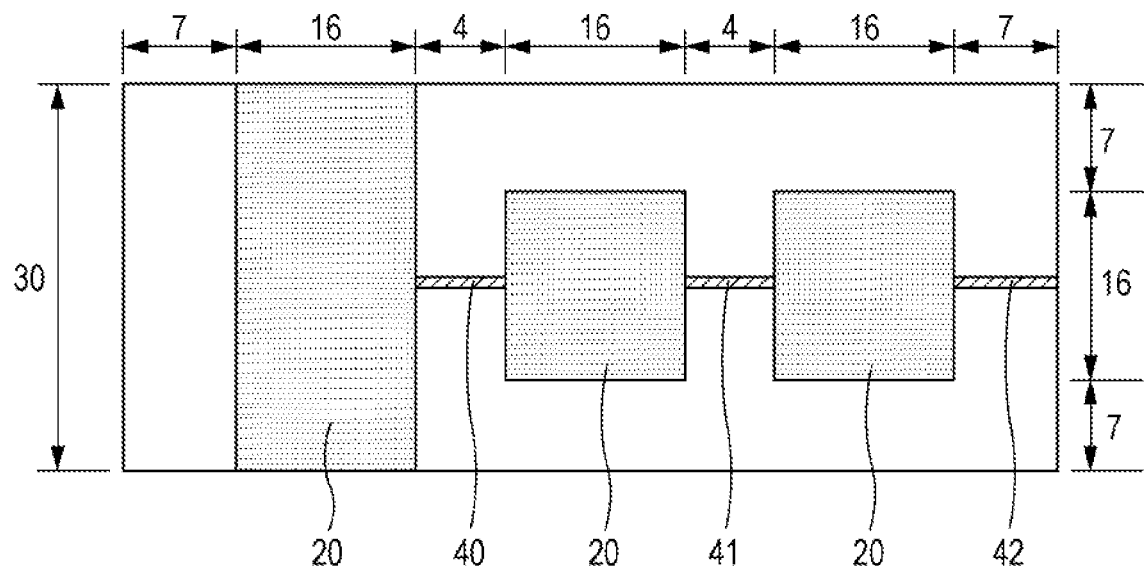
FIG. 15 illustrates an ITO pattern.
Figure 16:
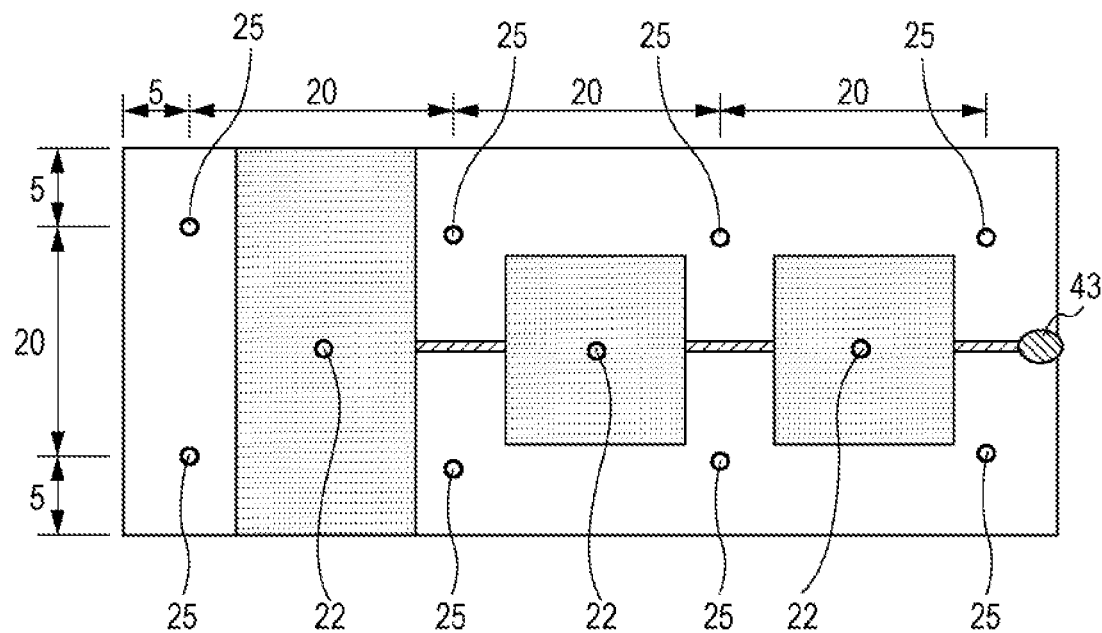
FIG. 16 illustrates the position to which a liquid crystal composition and an adhesive are dropped.
Figure 17:
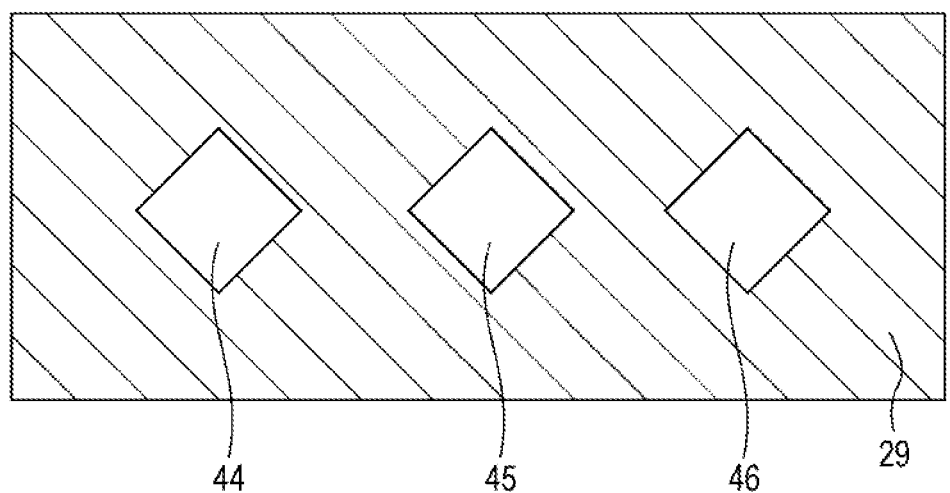
FIG. 17 illustrates the appearance of an electrostatic indicator according to an embodiment of the present invention.

A PET film substrate having a width of 3 cm, a length of 7 cm, a thickness of 50 μm, and a solid pattern of an ITO transparent electrode and a PET film substrate having a width of 3 cm, a length of 7 cm, a thickness of 50 μm, and a patterned ITO transparent electrode as illustrated in FIG. 15 were prepared. The widths of ITO transparent electrodes 40, 41, and 42 as resistors A, B, and C connecting the individual parts of the electrode that served to interpose the liquid crystal to form capacitors were finely adjusted such that the ITO transparent electrodes 40, 41, and 42 as resistors A, B, and C each had a resistance of 1 MΩ, respectively. A polyimide vertical alignment film was formed on each of the substrates having the ITO transparent electrode. As illustrated in FIG. 16, 0.8 mg of the composition N3R was dropped to 3 parts 22, and 3.1 mg of an ultraviolet curable adhesive 3052B manufactured by ThreeBond Co., Ltd. was dropped to 8 parts 25. In this state, the PET film having the solid electrode was attached thereto such that the electrode sides faced each other, and then pressure was applied to the entire surface. In this procedure, the films were attached to each other so as to be offset by 2 mm in the width direction but not to be offset in the length direction as illustrated in FIG. 9; in addition, the end of the ITO transparent electrode 42 (resistor C) was wired to establish ground. The distance between the two film substrates was 10 μm. The resulting product was irradiated with ultraviolet light having a wavelength of 365 nm at 300 mJ/cm² to cure the ultraviolet curable adhesive. Through this process, an electrostatic indicator according to an embodiment of the present invention, which had appearance illustrated in FIG. 17, was produced. A copper wire was bonded to the solid electrode to establish ground. A Van de Graaff static electricity generator (its charged part) was placed so as to be spaced apart from the electrostatic indicator by 15 cm. When the Van de Graaff static electricity generator was in an off-mode, all of the three liquid crystal parts (regions 44, 45, and 46) were transparent. When the Van de Graaff static electricity generator was turned on and charged to approximately 2 kV, only the liquid crystal part in which voltage was not divided (region 44) turned into deep red. In this state, the charged part of the Van de Graaff static electricity generator was gradually moved closer to the electrostatic indicator, and then the liquid crystal part in which voltage was divided to two third (region 45) also turned into deep red. Furthermore, the charged part of the Van de Graaff static electricity generator was further moved closer, and then the liquid crystal part in which voltage was divided to one third (region 46) also turned into deep red. As the electrostatic indicator became closer to the charged part of the Van de Graaff static electricity generator, the charge potential became higher. In response to an increase in the charge potential, the liquid crystal parts in which voltage was divided turned into red stepwise, which shows that the electrostatic indicator according to an embodiment of the present invention enabled the magnitude of charging to be easily comprehended.

What is claimed is:

1. An electrostatic indicator comprising:
    a pair of electrodes facing each other, the electrodes comprising a first electrode and a second electrode such that an external static electricity is applied therebetween;
    a liquid crystal composition disposed between the electrodes;
    a first region formed on the electrodes; and a second region formed on the electrodes,
wherein an alignment of the liquid crystal composition in the second region responds differently than that in the first region in response to the external static electricity applied between the electrodes to align liquid crystal compounds in the liquid crystal composition without external supply of electric power between the pair of electrodes.

2. The electrostatic indicator according to claim 1, wherein the liquid crystal composition disposed in the first region is different in a value of dielectric anisotropy from the liquid crystal composition disposed in the second region, such that the alignment of the liquid crystal composition in the second region responds differently than that in the first region when the external static electricity is applied.

3. The electrostatic indicator according to claim 1, wherein a thickness of the liquid crystal composition disposed between the electrodes of the first region is different from that disposed between the electrodes of the second region , such that the alignment of the liquid crystal composition in the second region responds differently than that in the first region when the external static electricity is applied.

4. The electrostatic indicator according to claim 1, wherein each of the first electrode and the second electrode comprises a substrate, and the liquid crystal composition is disposed between the two substrates.

5. The electrostatic indicator according to claim 1, wherein the first electrode is grounded.

6. The electrostatic indicator according to claim 1, wherein the second electrode in the first region and the second electrode in the second region have no electrical connection with each other.

7. The electrostatic indicator according to claim 4, wherein the second electrode in the first region and the second electrode in the second region have the same electric potential.

8. The electrostatic indicator according to claim 1, wherein the liquid crystal composition contains a dichroic dye.

9. The electrostatic indicator according to claim 1, wherein the liquid crystal composition comprises a cured product of a polymerizable compound.

10. The electrostatic indicator according to claim 1, wherein a voltage applied between the electrodes of the first region is different from that applied between the electrodes of the second region, such that the alignment of the liquid crystal composition in the second region responds differently than that in the first region when the external static electricity is applied.

11. The electrostatic indicator according to claim 1, wherein the first electrode is grounded,
wherein the external static electricity is applied when a charged object is placed at a side away from the second electrode such that the charged object is closer to the second electrode than the first electrode.

12. The electrostatic indicator according to claim 1, wherein the alignment of the liquid crystal composition in the second region responds differently than that in the first region in response to the external static electricity applied between the electrodes to align liquid crystal compounds in the liquid crystal composition so as to visualize a charge potential of the external static electricity without external supply of electric power between the pair of electrodes.

13. The electrostatic indicator according to claim 1, wherein the alignment of the liquid crystal composition in the second region responds differently than that in the first region in response to the external static electricity applied between the electrodes to align liquid crystal compounds in the liquid crystal composition so as to visualize a charge potential of the external static electricity without external supply of electric power between the pair of electrodes,
wherein the external static electricity is applied when a charged object is placed at a side away from the second electrode such that the charged object is closer to the second electrode than the first electrode.

* * * * *